(12) United States Patent
Gu et al.

(10) Patent No.: US 11,133,417 B1
(45) Date of Patent: Sep. 28, 2021

(54) TRANSISTORS WITH A SECTIONED EPITAXIAL SEMICONDUCTOR LAYER

(71) Applicant: GLOBALFOUNDRIES U.S. Inc., Santa Clara, CA (US)

(72) Inventors: Sipeng Gu, Clifton Park, NY (US); Judson Holt, Ballston Lake, NY (US); Haiting Wang, Clifton Park, NY (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 16/819,832

(22) Filed: Mar. 16, 2020

(51) Int. Cl.
| | |
|---|---|
| *H01L 29/00* | (2006.01) |
| *H01L 29/78* | (2006.01) |
| *H01L 29/08* | (2006.01) |
| *H01L 21/02* | (2006.01) |
| *H01L 29/10* | (2006.01) |
| *H01L 29/51* | (2006.01) |

(52) U.S. Cl.
CPC ...... *H01L 29/7856* (2013.01); *H01L 21/0245* (2013.01); *H01L 21/02293* (2013.01); *H01L 29/0847* (2013.01); *H01L 29/105* (2013.01); *H01L 29/515* (2013.01)

(58) Field of Classification Search
None
See application file for complete search history.

(56) References Cited

U.S. PATENT DOCUMENTS

| | | | |
|---|---|---|---|
| 2015/0200299 A1* | 7/2015 | Chen | H01L 29/7848 257/192 |
| 2015/0255543 A1 | 9/2015 | Cheng et al. | |
| 2015/0332972 A1 | 11/2015 | Wu et al. | |
| 2016/0087104 A1* | 3/2016 | Lee | H01L 29/66545 257/192 |
| 2019/0148492 A1 | 5/2019 | Yong et al. | |
| 2020/0105875 A1* | 4/2020 | Li | H01L 29/0847 |

\* cited by examiner

*Primary Examiner* — Reema Patel
(74) *Attorney, Agent, or Firm* — Thompson Hine LLP; Francois Pagette

(57) ABSTRACT

Structures for a field-effect transistor and methods of forming a structure for a field-effect transistor. First and second gate structures extend over the semiconductor body, a second gate structure that extends over the semiconductor body. A source/drain region is positioned laterally between the first gate structure and the second gate structure. The source/drain region includes a first semiconductor layer and a second semiconductor layer. The first semiconductor layer has a first section and a second section. The second semiconductor layer is positioned laterally between the first section of the first semiconductor layer and the second section of the first semiconductor layer.

20 Claims, 10 Drawing Sheets

TRANSISTORS WITH A SECTIONED EPITAXIAL SEMICONDUCTOR LAYER

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a channel region between the source and drain, and a gate electrode overlapped with the channel region. When a control voltage exceeding a characteristic threshold voltage is applied to the gate electrode, carrier flow occurs in the channel region between the source and drain to produce a device output current. A field-effect transistor may include multiple gates that overlap with multiple channel regions.

The source and drain of a field-effect transistor may be simultaneously formed. One approach is to implant ions containing an n-type dopant or a p-type dopant into regions of the semiconductor body to provide the source and drain. Another approach is to epitaxially grow sections of a semiconductor material from the semiconductor body to form the source and drain. The semiconductor material may be in situ doped during epitaxial growth with either an n-type dopant or a p-type dopant.

Wide gate pitches in a multi-gate field-effect transistor may cause significant underfilling of the semiconductor material that is epitaxially grown in cavities to provide the sources and drains. The underfilling may degrade device performance, such as degradation of radio-frequency performance metrics like power gain. The underfilling may also degrade other performance metrics. For example, the drain current when the transistor is biased in the saturation region (Idsat) may be reduced, and the contact resistance may be increased. The underfilling may also cause contact open issues.

Improved structures for a field-effect transistor and methods of forming a structure for a field-effect transistor are needed.

SUMMARY

In an embodiment of the invention, a structure for a field-effect transistor is provided. The structure includes a semiconductor body, a first gate structure that extends over the semiconductor body, a second gate structure that extends over the semiconductor body, and a source/drain region laterally between the first gate structure and the second gate structure. The source/drain region includes a first semiconductor layer and a second semiconductor layer. The first semiconductor layer has a first section and a second section. The second semiconductor layer is positioned laterally between the first section of the first semiconductor layer and the second section of the first semiconductor layer.

In an embodiment of the invention, a method of forming a structure for a field-effect transistor is provided. The method includes forming a first gate structure that extends over a semiconductor body, forming a second gate structure that extends over the semiconductor body, and forming a first semiconductor layer positioned on the semiconductor body between the first gate structure and the second gate structure. The method further includes forming a first section of a second semiconductor layer positioned laterally between the first gate structure and the first semiconductor layer, and forming a second section of a second semiconductor layer positioned laterally between the second gate structure and the first semiconductor layer. The first semiconductor layer and the first and second sections of the second semiconductor layer are components of a source/drain region of the field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
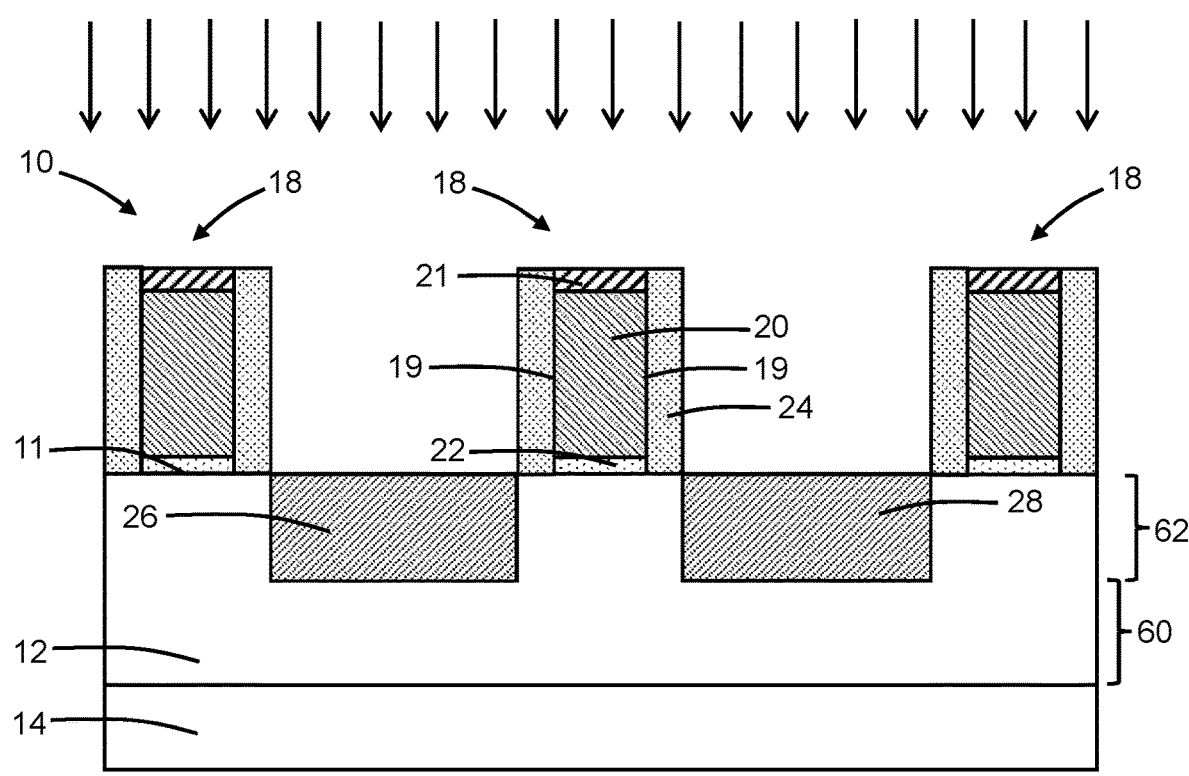
FIGS. 1-6 are cross-sectional views of a structure for a field-effect transistor at successive fabrication stages of a processing method in accordance with embodiments of the invention.

With reference to FIG. 1 and in accordance with embodiments of the invention, a structure 10 for a field-effect transistor includes a fin 12 that is arranged over, and projects upwardly away from, a substrate 14. The fin 12 and the substrate 14 may be composed of a single-crystal semiconductor material, such as single-crystal silicon. The fin 12 may be formed by patterning the substrate 14 with lithography and etching processes or by a self-aligned multi-patterning process. Shallow trench isolation 16 (FIGS. 7A, 7B, 7C) may surround a lower section 60 of the fin 12. An upper section 62 of the fin 12 is revealed above a top surface of the shallow trench isolation 16. The fin 12 defines a semiconductor body that may be used to form a field-effect transistor. The upper section 62 of the fin 12 includes a top surface 11.

Gate structures 18 extend laterally along respective longitudinal axes over and across the fin 12 and across the shallow trench isolation 16. Each gate structure 18 is aligned transverse to the fin 12 and overlaps with, and wraps about, the top surface 11 and side surfaces of the upper section 62 of the fin 12. Each gate structure 18 may include a dummy gate 20 composed of a conductor, such as polycrystalline silicon (i.e., polysilicon), and a dielectric layer 22 composed of an electrical insulator, such as silicon dioxide. A gate cap 21 may be arranged over each gate structure 18.

Sidewall spacers 24 are arranged adjacent to the side surfaces or sidewalls 19 of each gate structure 18. The sidewall spacers 24 may be formed by depositing a conformal layer composed of a dielectric material, such as a low-k dielectric material, and etching the deposited conformal layer with an anisotropic etching process, such as reactive ion etching.

Doped regions 26, 28 may be formed in the upper section 62 of the fin 12 and are arranged between the sidewall spacers 24 on the gate structures 18. The doped regions 26, 28 contain a concentration of either an n-type or p-type dopant. The doped regions 26, 28 may be formed by an ion implantation process that introduces energetic ions, as indicated diagrammatically by the single-headed arrows, with ion trajectories that stop over a depth range in the fin 12. The ions may be generated from a suitable source gas and implanted into the fin 12 with given implantation conditions using an ion implantation tool. The implantation conditions (e.g., ion species, dose, kinetic energy, tilt angle) may be selected to tune the characteristics (e.g., depth profile) of the doped regions 26, 28. An implantation mask may be temporarily formed over other regions of the substrate 14 used to form different types of field-effect transistors.

In an embodiment, the doped regions 26, 28 may be concurrently formed in the fin 12 by implanting ions of a p-type dopant (e.g., boron) that provides p-type electrical conductivity. In an alternative embodiment, the doped regions 26, 28 may be concurrently formed in the fin 12 by implanting ions of an n-type dopant (e.g., phosphorus and/or arsenic) that provides n-type conductivity. In an embodiment, the dopant concentrations of the doped regions 26, 28 may be equal or substantially equal. The gate structures 18 and sidewall spacers 24 may function to self-align the ion-implantation process.

In an alternative embodiment, the doped regions 26, 28 may be omitted from the device construction such that the doping, if any, of the fin 12 is unmodified.

Figure 2:
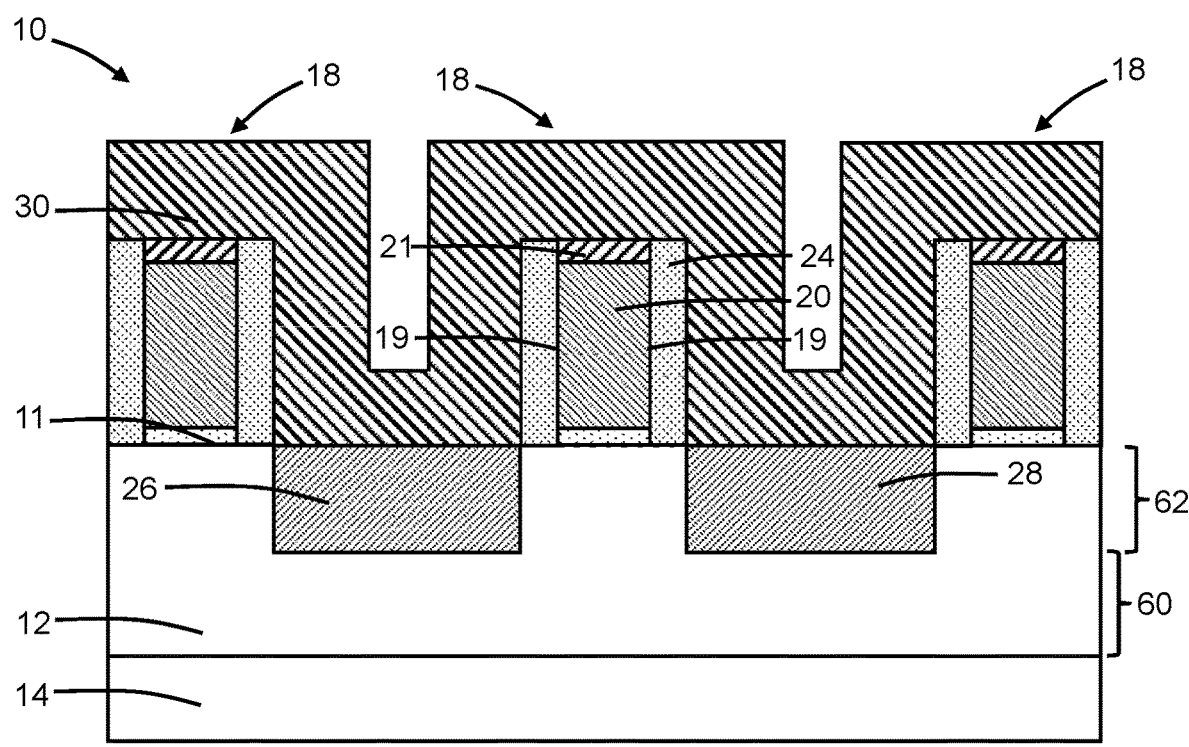

With reference to FIG. 2 in which like reference numerals refer to like features in FIG. 1 and at a subsequent fabrication stage, a conformal layer 30 is deposited as a liner over the gate caps 21 on the gate structures 18, the sidewall spacers 24, and the doped regions 26, 28. The conformal layer 30 may be composed of, for example, amorphous carbon and may be deposited by, for example, atomic layer deposition. The material of the conformal layer 30 may be chosen to differ from the materials of the gate caps 21 and sidewall spacers 24 in order to facilitate subsequent etching processes.

Figure 3:
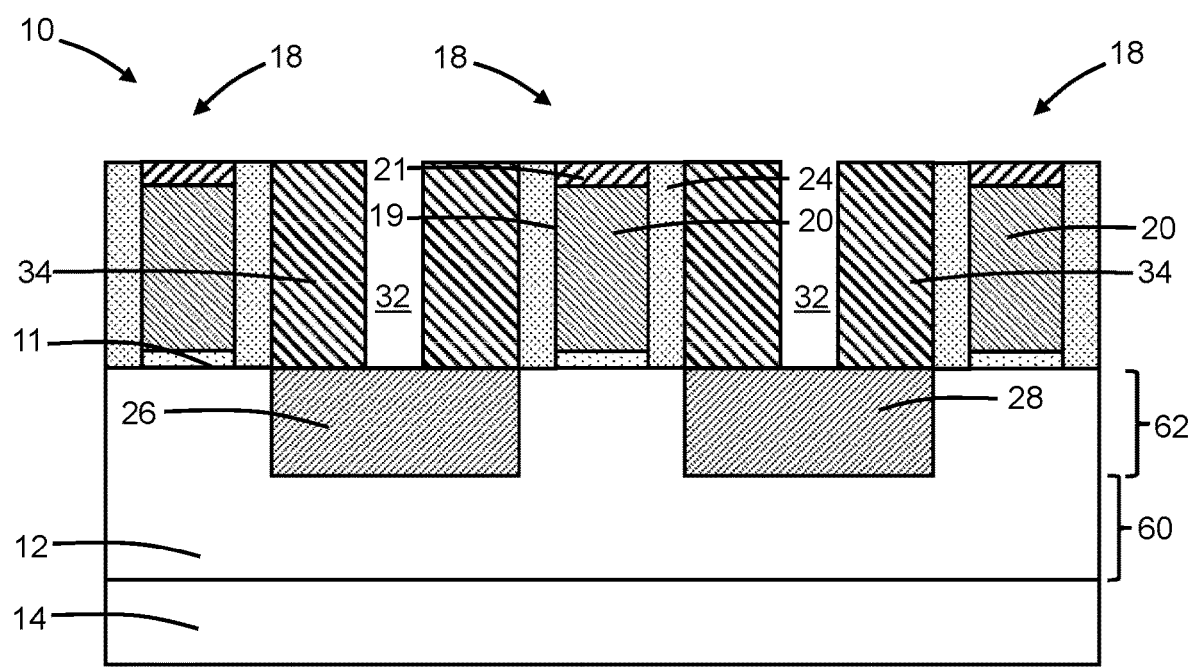

With reference to FIG. 3 in which like reference numerals refer to like features in FIG. 2 and at a subsequent fabrication stage, spacers 34 are formed by etching the conformal layer 30 (FIG. 2) with an anisotropic etching process. The etching process may be a reactive ion etching process that etches the material constituting the spacers 34 selective to the materials of the gate caps 21, sidewall spacers 24, and fin 12. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal. The spacers 34, which are temporary structural components, may have approximately the same height as the sidewall spacers 24 relative to the top surface 11 of the fin 12. Openings 32 are defined between the spacers 34 and extend in a vertical direction to the doped regions 26, 28. The top surface 11 of the fin 12 over each of the doped regions 26, 28 is exposed at the bottom of the openings 32 due to the removal of the conformal layer 30 by the etching process.

Figure 4:
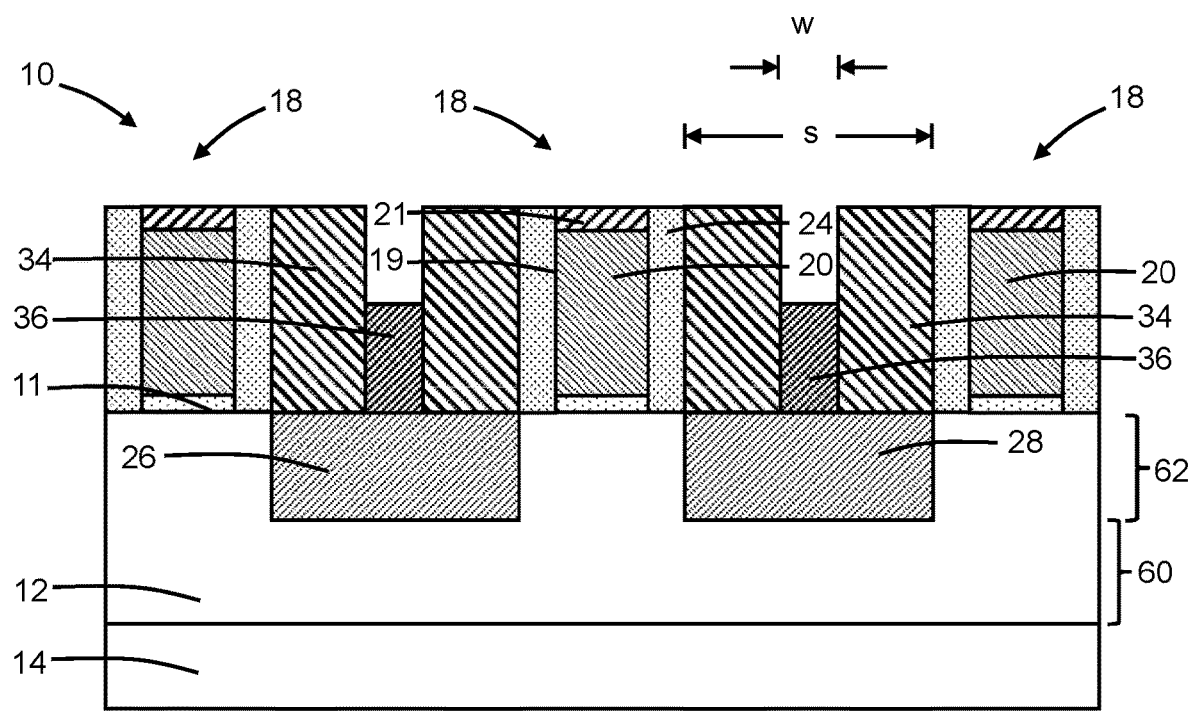

With reference to FIG. 4 in which like reference numerals refer to like features in FIG. 3 and at a subsequent fabrication stage, a layer 36 is epitaxially grown in sections from the top surface 11 (FIG. 7B) of the upper section 62 of the fin 12 over the doped regions 26, 28. The layer 36 may be composed of a semiconductor material. The material of the semiconductor layer 36 may be chosen relative to the material of the fin 12 such that the fin 12 may be etched selectively to the semiconductor layer 36. In an embodiment, the layer 36 may be composed of silicon-germanium. The material of the semiconductor layer 36 may be chosen relative to the material of the fin 12 such that the fin 12 and the semiconductor layer 36 lack etch selectivity. In an alternative embodiment, the layer 36 may be composed of silicon or silicon-phosphorus.

The semiconductor layer 36 may be in direct contact with the top surface 11 of the fin 12 over each of the doped regions 26, 28. The epitaxial growth process may be selective in that the material of the semiconductor layer 36 does not grow from dielectric surfaces, such as the surfaces of the shallow trench isolation 16, the gate caps 21, the sidewall spacers 24, and the spacers 34. Due to the constraint provided during epitaxial growth, the semiconductor layer 36 forms in sections that have the same width as the openings 32.

The thickness of the semiconductor layer 36, which may be measured in a vertical direction relative to a reference plane defined by the top surface 11 of the fin 12, is less than the height of the spacers 34 relative to the same reference plane. The portions of the doped regions 26, 28 that are covered by the spacers 34 are not covered by the sections of the epitaxially-grown semiconductor layer 36. Each section of the semiconductor layer 36 may have a width, w, that is less than the spacing, s, between the sidewall spacers 24 on the adjacent gate structures 18.

Figure 5:
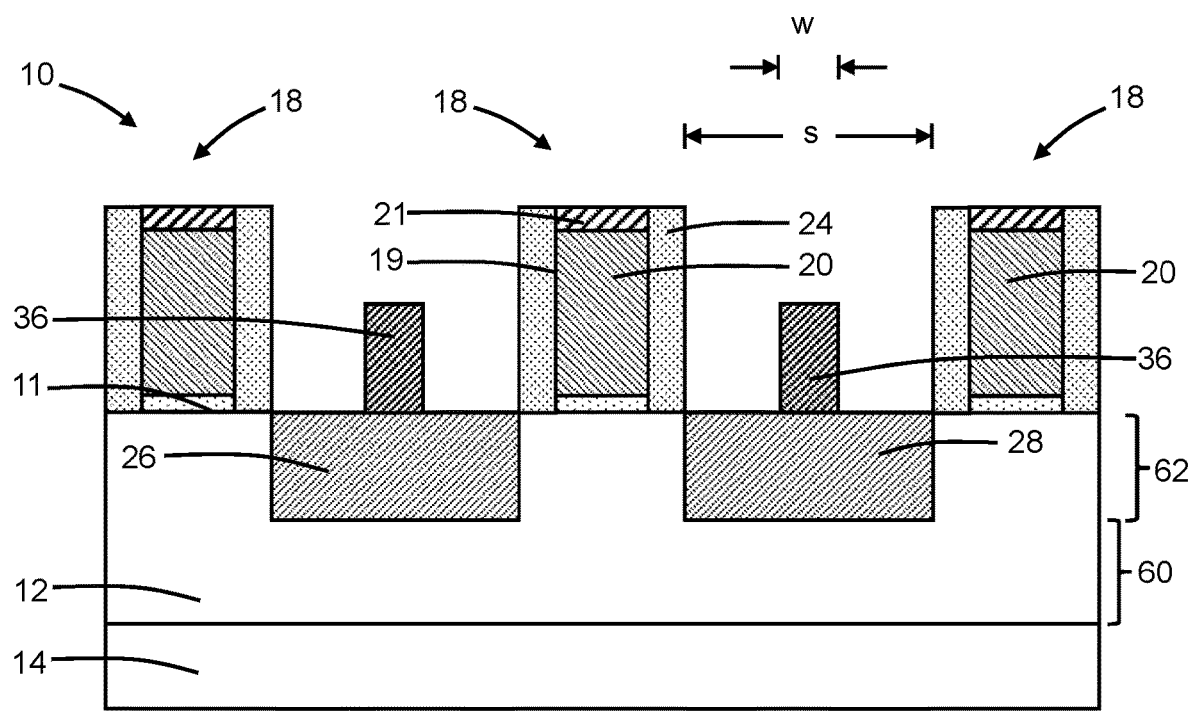

With reference to FIG. 5 in which like reference numerals refer to like features in FIG. 4 and at a subsequent fabrication stage, the spacers 34 are removed to expose the portions of the doped regions 26, 28 that were formerly covered by the spacers 34 are not covered by the sections of the semiconductor layer 36. The spacers 34 may be removed by an etching process selective to the semiconductor material of the layer 36 such that its sections remain intact and cover respective portions of the doped regions 26, 28. The etching process may also remove the spacers 34 selective to the gate caps 21 and sidewall spacers 24. The respective portions of the doped regions 26, 28 covered by the sections of the semiconductor layer 36 may be equidistant from the adjacent pair of gate structures 18.

Figure 6:
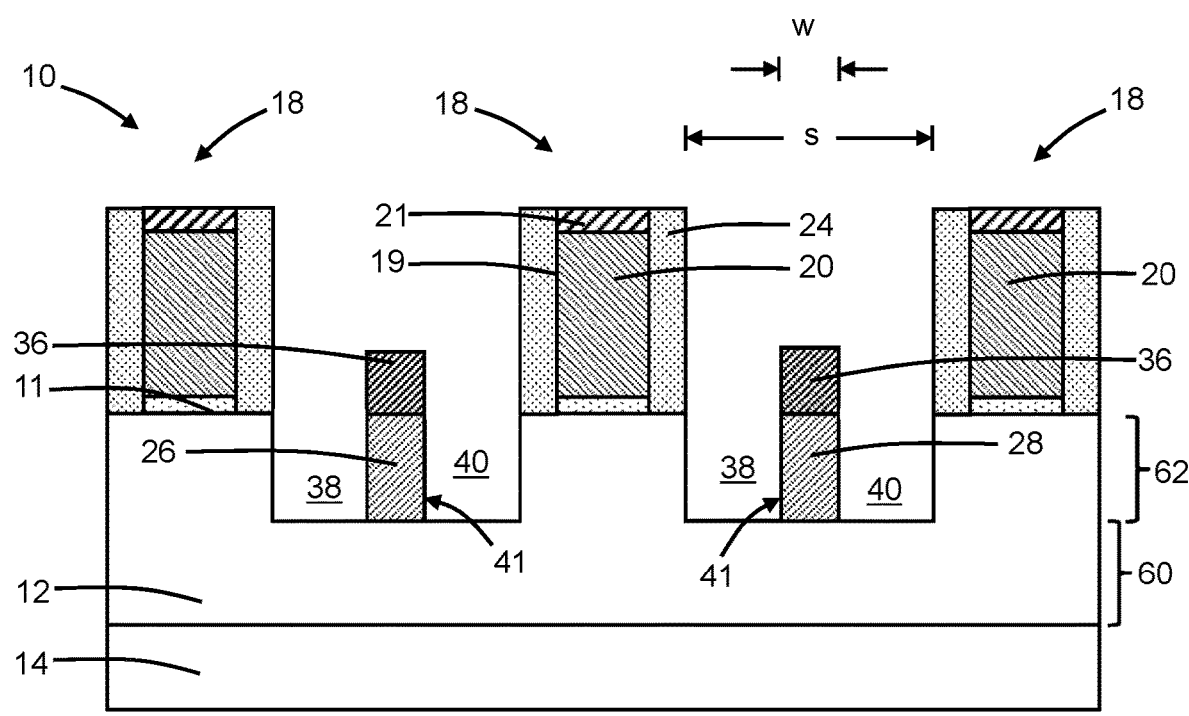

With reference to FIG. 6 in which like reference numerals refer to like features in FIG. 5 and at a subsequent fabrication stage, cavities 38, 40 are formed in the fin 12 between each adjacent pair of gate structures 18. The cavities 38, 40 may extend to a given depth, d, into the fin 12. The cavities 38, 40 may be formed by an etching process selective to the gate caps 21 and sidewall spacers 24. The sections of the semiconductor layer 36 function as protective caps during the etching process such that a portion 41 of the fin 12 is masked and preserved in each instance laterally between the cavity 38 and the cavity 40. The sections of the semiconductor layer 36 may be eroded and shortened, but not consumed and removed, by the etching process. In an embodiment, the thickness of the sections of the semiconductor layer 36 may be greater than the depth of the cavities 38, 40. The sections of the semiconductor layer 36 are positioned over and above the portions 41 of the fin 12. In an embodiment, the sections of the semiconductor layer 36 and the portions 41 of the fin 12 have substantially equal widths. In an embodiment, the sections of the semiconductor layer 36 are in direct contact with the portions 41 of the fin 12.

The formation of the cavities 38, 40 removes portions of the doped regions 26, 28 adjacent to the portions 41 of the fin 12. A portion of the doped region 26 and a portion of the doped region 28 remain intact in the respective portions 41 of the fin 12. In an embodiment, the depth of the cavities 38, 40 may be equal or substantially equal to the thickness of the doped regions 26, 28.

With reference to FIGS. 7, 7A, 7B, 7C in which like reference numerals refer to like features in FIG. 6 and at a subsequent fabrication stage, a layer 42 of an epitaxial semiconductor material is grown in respective sections from the surfaces of the fin 12 bordering the cavities 38, 40 and, in particular, from the top surface 11 and side surfaces 13 of the portions 41 of the fin 12 between the cavities 38, 40. The sections of the epitaxial semiconductor layer 42 grow independently inside each of the cavities 38, 40, which provides a significantly larger surface area for epitaxial growth than a single large cavity. The epitaxial semiconductor layer 42 may extend laterally from the space between the gate structures 18 and provides a cladding on the sections of the semiconductor layer 36, which are embedded in the epitaxial semiconductor layer 42. Each section of the epitaxial semiconductor layer 42 is located in part in one of the cavities 38, 40, and extends in part above the top surface 11 of the fin 12. The different sections of the epitaxial semiconductor layer 42 merge above the associated section of the semiconductor layer 36.

The epitaxial growth process may be selective in that the semiconductor material does not grow from dielectric surfaces, such as the surfaces of the shallow trench isolation 16, the gate caps 21, and the sidewall spacers 24. The epitaxial semiconductor layer 42 may be in situ doped during epitaxial growth with a concentration of a dopant. In an embodiment, the epitaxial semiconductor layer 42 may have the same conductivity type as the doped regions 26, 28. In an embodiment, the epitaxial semiconductor layer 42 may be in situ doped during epitaxial growth with an n-type dopant, such as phosphorus and/or arsenic, that provides n-type conductivity. In an alternative embodiment, the epitaxial semiconductor layer 42 may be in situ doped during epitaxial growth with a p-type dopant, such as boron, that provides p-type conductivity. The epitaxial semiconductor layer 42 may have a composition that contains germanium and silicon and, in an embodiment, the epitaxial semiconductor layer 42 may be composed of silicon-germanium. In an embodiment, the epitaxial semiconductor layer 42 may be composed of silicon and may contain an n-type dopant (e.g., phosphorus). In an alternative embodiment, the epitaxial semiconductor layer 42 may be composed of silicon-germanium and may contain a p-type dopant (e.g., boron).

The sections of the epitaxial semiconductor layer 42 in each pair of cavities 38, 40 contact the portion 41 of the fin 12 between the cavity 38 and the cavity 40. The semiconductor layer 42 is also in direct contact with the section of the semiconductor layer 36 on each portion 41 of the fin 12. The section of the epitaxial semiconductor layer 42 in each cavity 38 may be in direct contact with one side surface 13 of the portion 41 of the fin 12 and the overlying section of the semiconductor layer 36, and the section of the epitaxial semiconductor layer 42 in each cavity 40 may be in direct contact with an opposite side surface 13 of the portion 41 of the fin 12 and the overlying section of the semiconductor layer 36. Portions of the doped regions 26, 28 are respectively included in the portions 41 of the fins 12 beneath the sections of the semiconductor layer 36. The portion 41 of the fin 12 defines a partition between the section of the epitaxial semiconductor layer 42 in the cavity 38 and the section of the epitaxial semiconductor layer 42 in the cavity 40. The portion 43 of the fin 12 defines a partition between the section of the epitaxial semiconductor layer 42 in the cavity 38 and the section of the epitaxial semiconductor layer 42 in the cavity 40.

Figure 7:
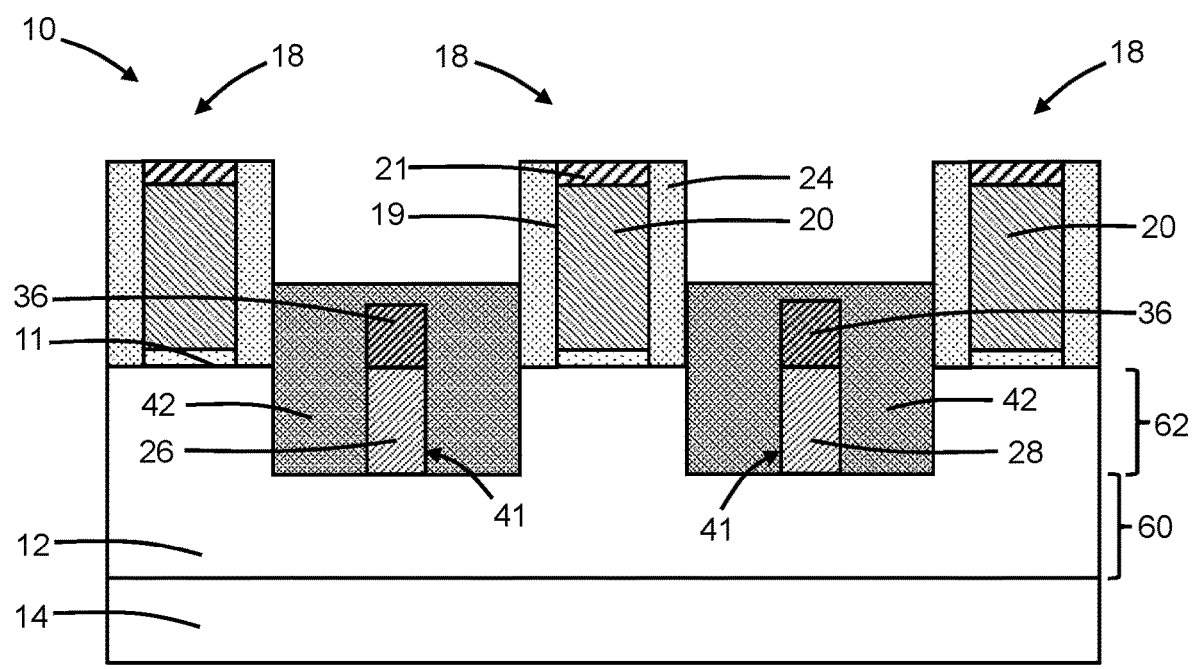
FIG. 7 is a cross-sectional view of the structure at a fabrication stage of the processing method subsequent to FIG. 6.
Figure 7A:
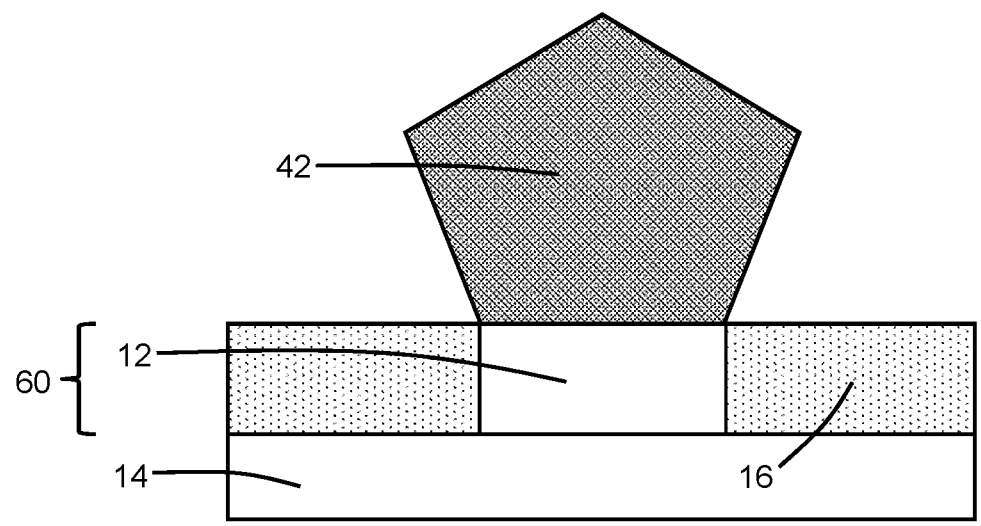
FIGS. 7A, 7B, 7C are cross-sectional views of different portions of the structure of FIG. 7 taken generally parallel to the longitudinal axes of the gate structures.
Figure 7B:
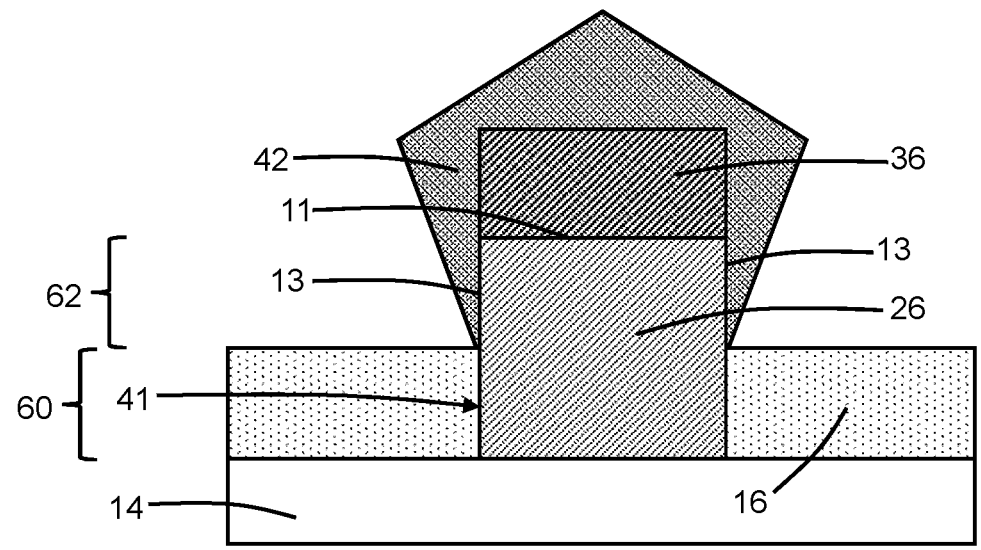
Figure 7C:
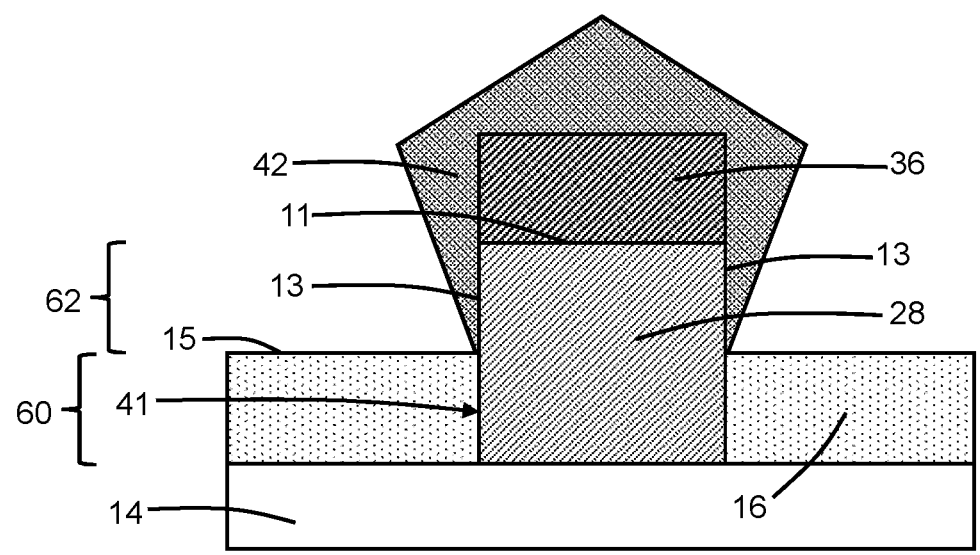
Figure 8:
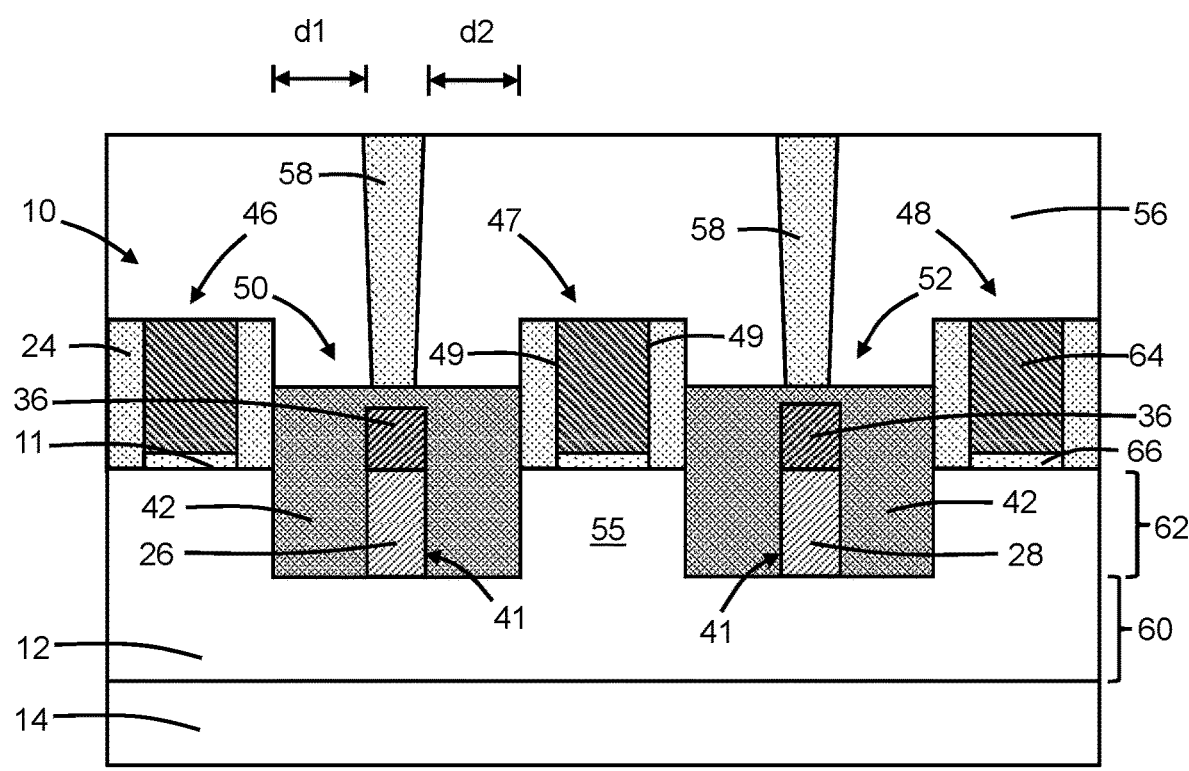
FIG. 8 is a cross-sectional view of the structure at a fabrication stage of the processing method subsequent to FIG. 7.

With reference to FIG. 8 in which like reference numerals refer to like features in FIG. 7 and at a subsequent fabrication stage, a replacement gate process is performed to replace the gate structures 18 with gate structures 46, 47, 48 and complete the structure 10 for the field-effect transistor. The gate structures 46, 47, 48 may include an electrode layer 64 composed of one or more metal gate materials, such as work function metals, and a gate dielectric layer 66 composed of a dielectric material, such as a high-k dielectric material like hafnium oxide.

The structure 10 includes a source/drain region 50 provided by a section of the semiconductor layer 42, a section of the semiconductor layer 36, and the doped region 26 in a portion 41 of the fin 12. The structure 10 includes a source/drain region 52 provided by a section of the semiconductor layer 42 and the doped region 28 in a portion 41 of the fin 12. As used herein, the term "source/drain region" means a doped region of semiconductor material that can function as either a source or a drain of a field-effect transistor. In an embodiment, the source/drain region 50 may provide a source in the structure 10, and the source/drain region 52 may provide a drain in the structure 10. In an alternative embodiment, the source/drain region 50 may provide a drain in the structure 10, and the source/drain region 52 may provide a source in the structure 10. The source/drain regions 50, 52 are doped to have a conductivity type of the same polarity. The fin 12 provides a semiconductor body used to form the source/drain regions 50, 52, and the source/drain regions 50, 52 have a symmetrical arrangement.

A channel region 55 is disposed in a portion of the fin 12 between the source/drain region 50 and the source/drain region 52 and beneath an overlying gate structure 47. The section of the semiconductor layer 36 included in the source/drain region 50 is laterally spaced from the sidewall spacers 24 on the adjacent sidewalls 49 of the gate structures 46, 47 by respective distances d1 and d2. In an embodiment, the distances d1 and d2 may be equal or substantially equal. Similarly, the section of the semiconductor layer 36 included in the source/drain region 52 is laterally spaced from the sidewall spacers 24 on the adjacent sidewalls 49 of the gate structures 47, 48 by respective distances d1 and d2.

Middle-of-line processing and back-end-of-line processing follow, which includes formation of contacts, vias, and wiring for an interconnect structure that is coupled with the field-effect transistor. Contacts 56, which are located in an interlayer dielectric layer 58 of the interconnect structure, are coupled with the source/drain regions 50, 52.

The source/drain regions 50, 52 may exhibit improvements in filling by the epitaxial semiconductor material of the epitaxial semiconductor layer 42. Reliance upon smaller cavities 38, 40, instead of a single larger cavity, provides a larger seed area for epitaxial growth and smaller volumes to be filled and may compensate for larger gate pitches to alleviate underfilling. The source/drain regions 50, 52 may include a larger overall volume of epitaxial semiconductor material as a result. The presence of the sections of the semiconductor layer 36, which are embedded in the sections of the epitaxial semiconductor layer 42, may function to reduce contact resistance. The structure 10 may include additional gate structures with the wider gate pitch, and the source/drain regions 52, 54 may be repeated for the pairs of the gate structures to form a multi-gate field-effect transistor for use in a radiofrequency integrated circuit.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a semiconductor body including a first cavity, a second cavity, and a portion that is laterally positioned between the first cavity and the second cavity;
   a first gate structure that extends over the semiconductor body;
   a second gate structure that extends over the semiconductor body; and
   a first source/drain region laterally between the first gate structure and the second gate structure, the first source/drain region including a first semiconductor layer and a second semiconductor layer, the first semiconductor layer having a first section and a second section, the first section of the first semiconductor layer positioned in the first cavity, the second section of the first semiconductor layer positioned in the second cavity, and the second semiconductor layer positioned laterally between the first section of the first semiconductor layer and the second section of the first semiconductor layer.

2. The structure of claim 1 wherein the second semiconductor layer is positioned on the portion of the semiconductor body.

3. The structure of claim 2 wherein the second semiconductor layer is in direct contact with the portion of the semiconductor body.

4. The structure of claim 1 wherein the portion of the semiconductor body includes a doped region containing a dopant.

5. The structure of claim 1 wherein the portion of the semiconductor body and the second semiconductor layer have substantially equal widths.

6. The structure of claim 1 wherein the first section of the first semiconductor layer in the first cavity is in direct contact with the portion of the semiconductor body, and the second section of the first semiconductor layer in the second cavity is in direct contact with the portion of the semiconductor body.

7. The structure of claim 1 wherein the semiconductor body is a semiconductor fin.

8. The structure of claim 1 wherein the semiconductor body has a top surface, and the first section and the second section of the first semiconductor layer include respective portions that merge over the top surface of the semiconductor body.

9. The structure of claim 1 wherein the semiconductor body has a top surface, and the second semiconductor layer is positioned in direct contact with the top surface of the semiconductor body.

10. The structure of claim 1 further comprising:
    a contact connected to the first source/drain region.

11. The structure of claim 1 wherein the second semiconductor layer is comprised of a semiconductor material containing germanium.

12. The structure of claim 1 wherein the second semiconductor layer is comprised of silicon-germanium.

13. The structure of claim 1 further comprising:
    a second source/drain region including a third semiconductor layer and a fourth semiconductor layer, the third semiconductor layer having a first section and a second section, the fourth semiconductor layer positioned laterally between the first section of the third semiconductor layer and the second section of the third semiconductor layer,
    wherein the first gate structure is positioned laterally between the first source/drain region and the second source/drain region.

14. The structure of claim 1 wherein the portion of the semiconductor body has first side surface and a second side surface opposite to the first side surface, the first section of the first semiconductor layer in the first cavity is in direct contact with the first side surface of the portion of the semiconductor body, and the second section of the first semiconductor layer is in direct contact with the second side surface of the portion of the semiconductor body.

15. The structure of claim 14 wherein the second semiconductor layer is positioned on the portion of the semiconductor body, the first section of the first semiconductor layer in the first cavity is in direct contact with the second semiconductor layer, and the second section of the first semiconductor layer is in direct contact with the second semiconductor layer.

16. A method of forming a structure for a field-effect transistor, the method comprising:
forming a first cavity and a second cavity in a semiconductor body;
forming a first gate structure that extends over the semiconductor body;
forming a second gate structure that extends over the semiconductor body;
forming a first semiconductor layer positioned on the semiconductor body between the first gate structure and the second gate structure;
forming a first section of a second semiconductor layer that is positioned laterally between the first gate structure and the first semiconductor layer; and
forming a second section of the second semiconductor layer that is positioned laterally between the second gate structure and the first semiconductor layer,
wherein the first section of the first semiconductor layer is formed in the first cavity, the second section of the first semiconductor layer is formed in the second cavity, a portion that is laterally positioned between the first cavity and the second cavity, and the first semiconductor layer, the first section of the second semiconductor layer, and the second section of the second semiconductor layer are components of a source/drain region of the field-effect transistor.

17. The method of claim 16, wherein the first section of the first semiconductor layer is epitaxially grown in the first cavity, and the second section of the first semiconductor layer is epitaxially grown in the second cavity.

18. The method of claim 17 wherein the second semiconductor layer is positioned on the portion of the semiconductor body.

19. The method of claim 18 wherein the portion of the semiconductor body includes a doped region containing a dopant.

20. The method of claim 18 wherein the first section of the first semiconductor layer in the first cavity is in direct contact with the portion of the semiconductor body, and the second section of the first semiconductor layer is in direct contact with the portion of the semiconductor body.

* * * * *

UNITED STATES PATENT AND TRADEMARK OFFICE
CERTIFICATE OF CORRECTION

| | | |
|---|---|---|
| PATENT NO. | : 11,133,417 B1 | Page 1 of 1 |
| APPLICATION NO. | : 16/819832 | |
| DATED | : September 28, 2021 | |
| INVENTOR(S) | : Sipeng Gu, Judson Holt and Haiting Wang | |

It is certified that error appears in the above-identified patent and that said Letters Patent is hereby corrected as shown below:

In the Claims

Column 10, Claim 16, Lines 3-4 read:
"semiconductor layer is formed in the second cavity, a portion that is laterally positioned between the first"

It should read:
--semiconductor layer is formed in the second cavity, the semiconductor body includes a portion that is laterally positioned between the first--

Signed and Sealed this
Nineteenth Day of December, 2023

Katherine Kelly Vidal
*Director of the United States Patent and Trademark Office*